United States Patent
Takada et al.

(10) Patent No.: US 6,753,255 B1
(45) Date of Patent: Jun. 22, 2004

(54) PROCESS FOR WAFER EDGE PROFILE CONTROL USING GAS FLOW CONTROL RING

(75) Inventors: Kaoru Takada, Tsukaba (JP); Masaru Shimizu, Tsukaba (JP); Masanori Kanayasu, Ibaraki-ken (JP); Shinsuke Ichikawa, Tsukaba (JP)

(73) Assignee: LSI Logic Corporation, Milpitas, CA (US)

( * ) Notice: Subject to any disclaimer, the term of this patent is extended or adjusted under 35 U.S.C. 154(b) by 5 days.

(21) Appl. No.: 10/200,469

(22) Filed: Jul. 18, 2002

Related U.S. Application Data

(60) Provisional application No. 60/381,746, filed on May 17, 2002.

(51) Int. Cl.$^7$ .............................................. H01L 21/44
(52) U.S. Cl. ...................................... 438/680; 438/758
(58) Field of Search ................................. 438/680–758, 438/783

(56) References Cited

U.S. PATENT DOCUMENTS 5,626,677 A * 5/1997 Shirahata .................... 118/719

* cited by examiner

*Primary Examiner*—Dung A. Le
(74) *Attorney, Agent, or Firm*—Beyer, Weaver, Thomas

(57) ABSTRACT

A chemical vapor deposition process controls the thickness of a film on an edge of a wafer by modifying the density of flow gases at the edge of the wafer through the use of a gas flow control ring. The deposition process is performed with the gas flow control ring disposed about a wafer holding region on a wafer holder. The top surface of the gas flow control ring is controlled relative to the top surface of the wafer to adjust the thickness of the film deposited on the wafer edge. In one particular embodiment, the gas flow control ring has a top surface in the same plane as the top surface of the wafer. In another embodiment, the deposition process is performed with the clearance between the inner diameter of the gas flow control ring and the periphery of the wafer minimized.

10 Claims, 5 Drawing Sheets

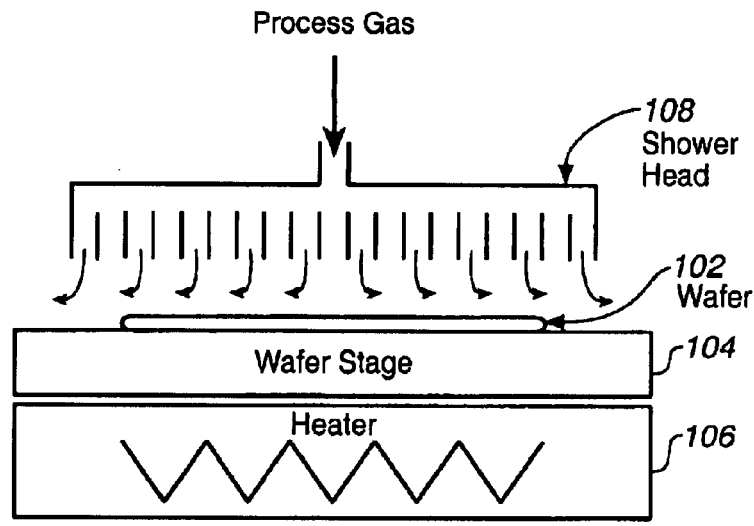
FIG._1
(PRIOR ART)
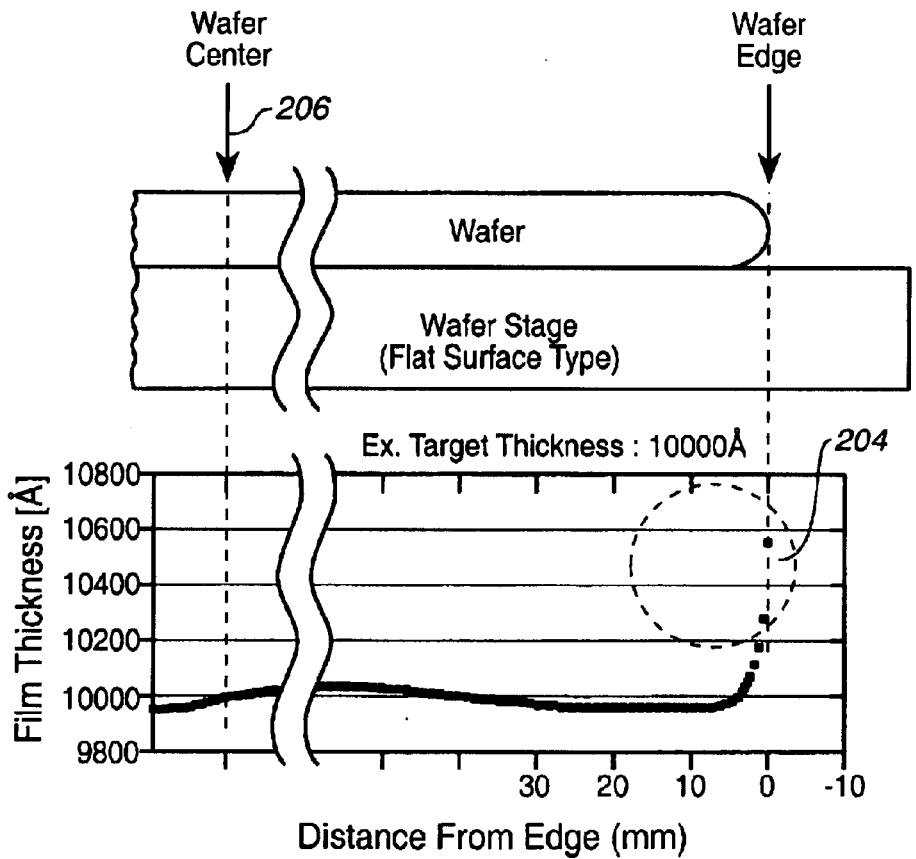
FIG._2
(PRIOR ART)

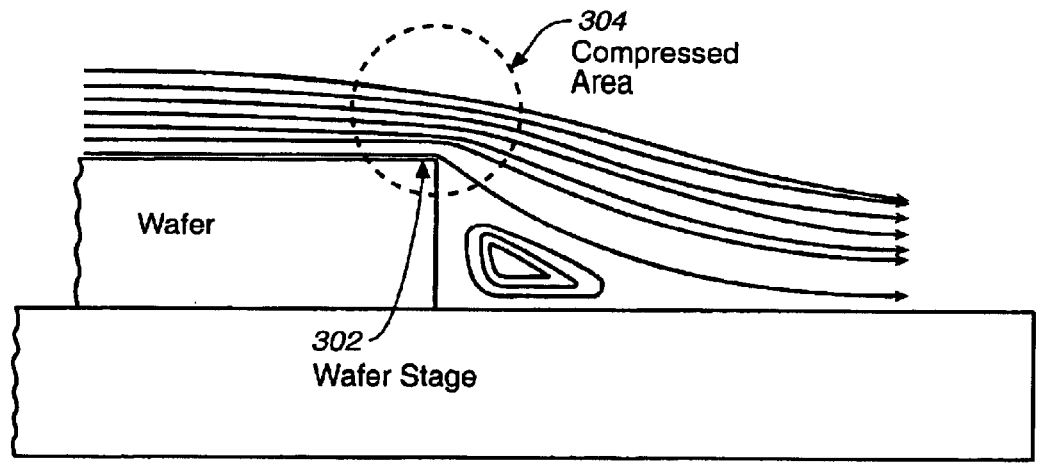
FIG._3
*(PRIOR ART)*
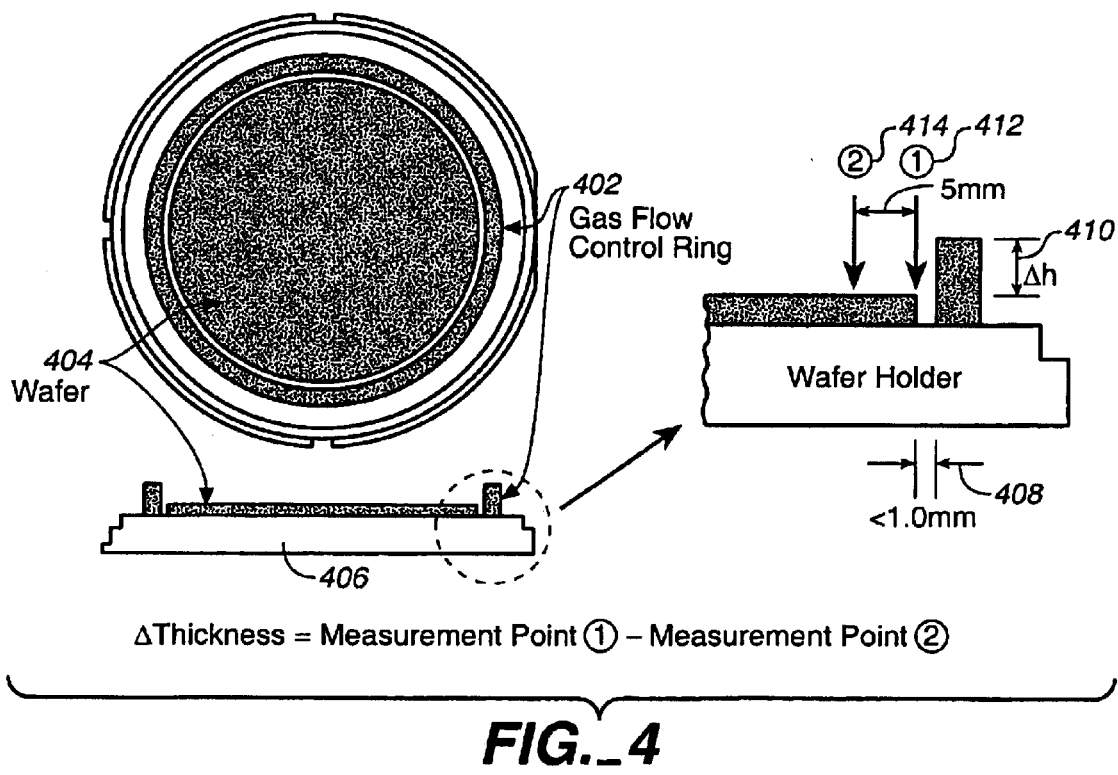
ΔThickness = Measurement Point ① − Measurement Point ②
FIG._4

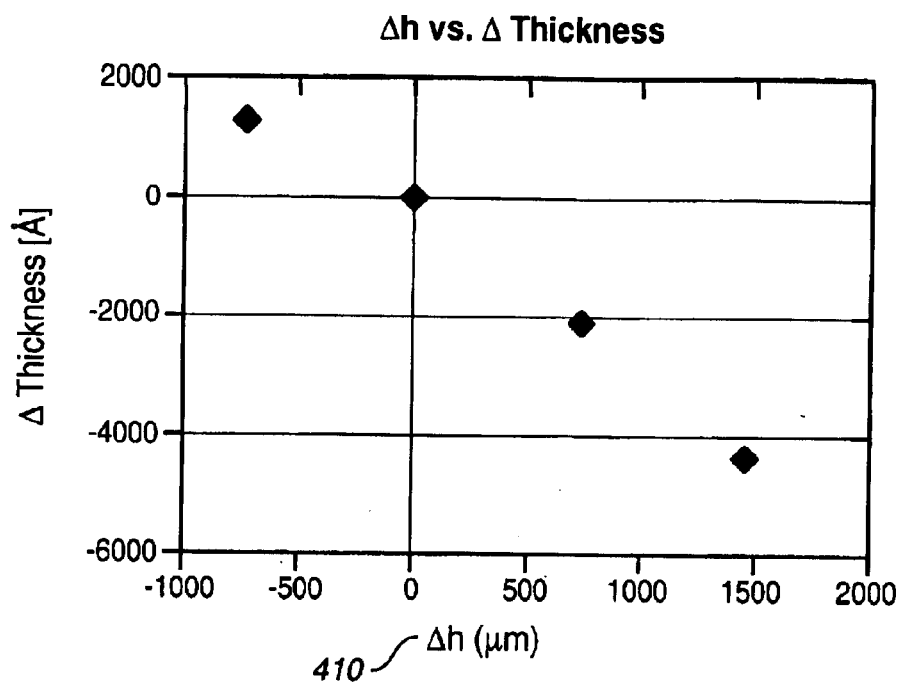
FIG._5
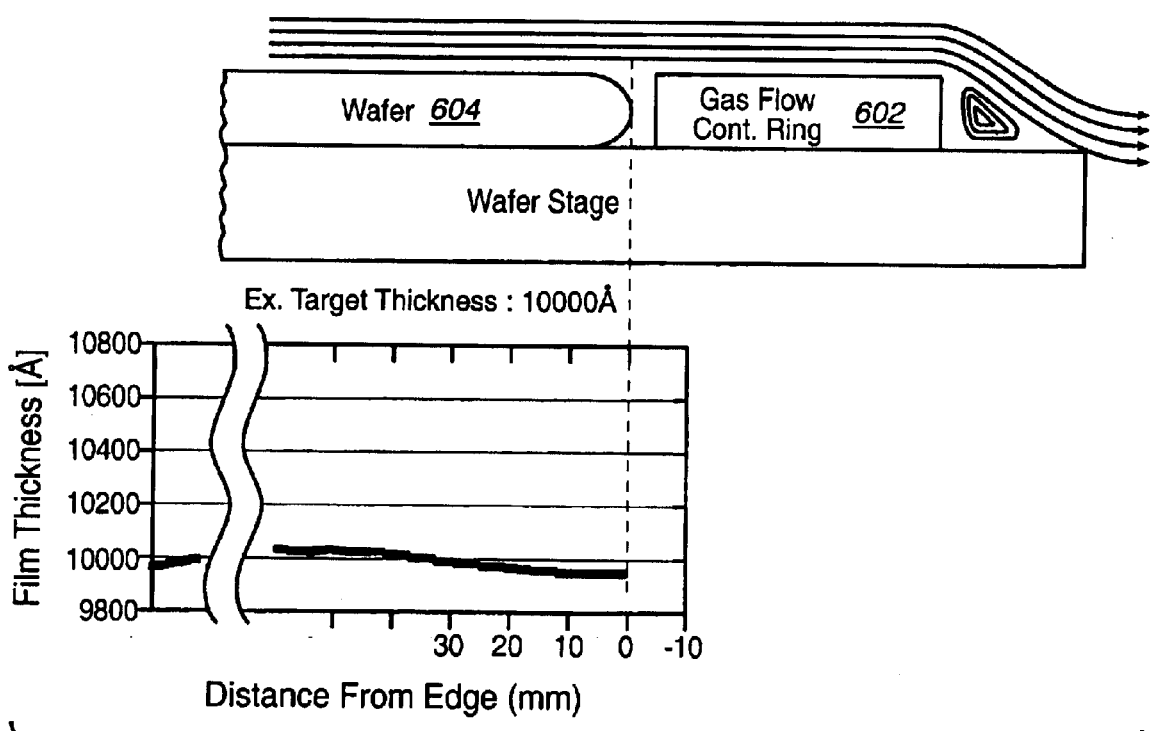
FIG._6

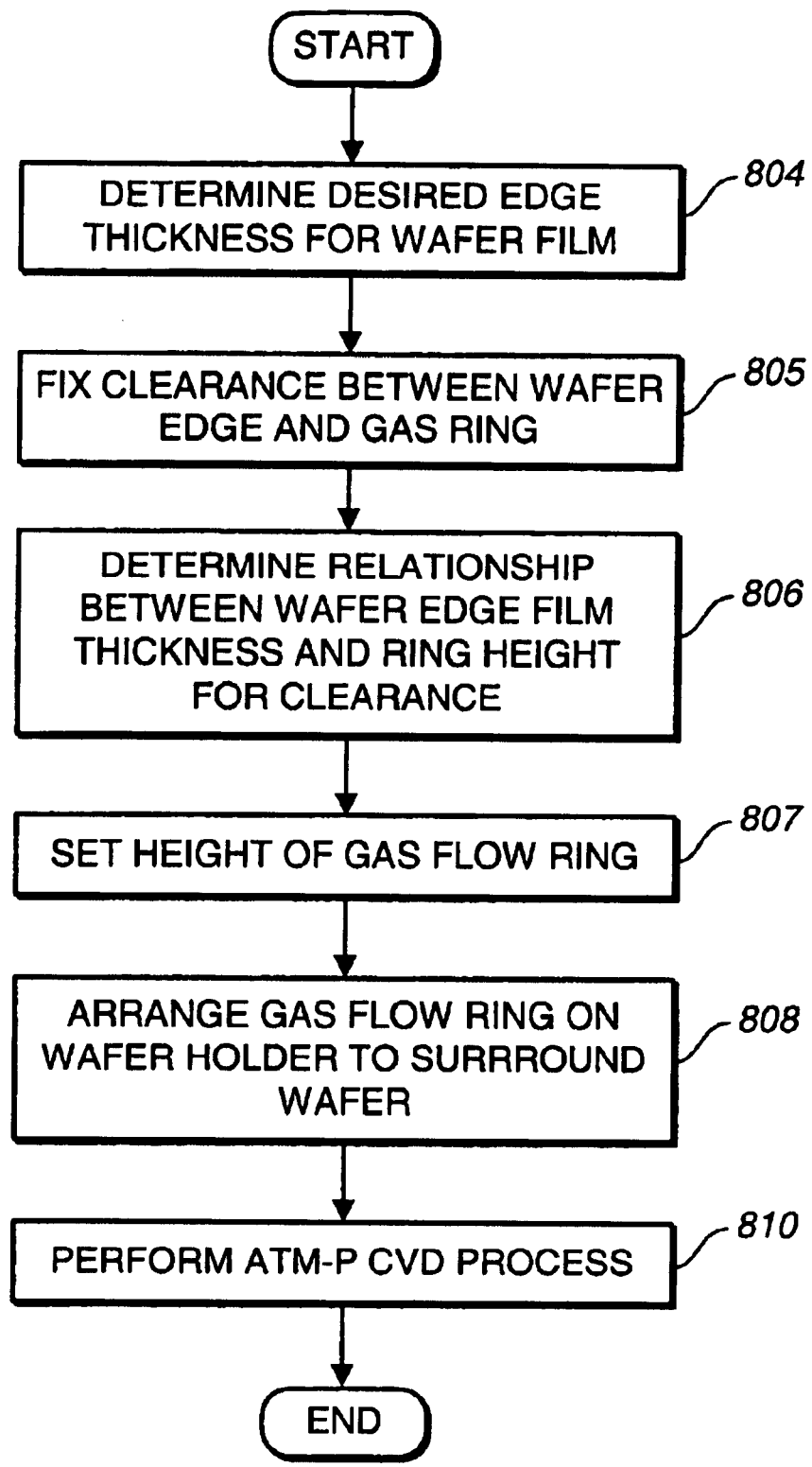
FIG._8

PROCESS FOR WAFER EDGE PROFILE CONTROL USING GAS FLOW CONTROL RING

CROSS-REFERENCE TO RELATED APPLICATION

This application takes priority under U.S.C. 119(e) of U.S. Provisional Application No. 60/381,746 filed May 17, 2002 entitled, "PROCESS AND APPARATUS FOR WAFER EDGE PROFILE CONTROL USING GAS FLOW CONTROL RING" by Kaoru Takada, Masaru Shimizu, Masanori Kanayasu, and Shinsuke Ichikawa, which is incorporated by reference in its entirety for all purposes.

BACKGROUND OF THE INVENTION

1. Field of the Invention

The present invention relates generally to methods for controlling the formation of films in semiconductor processing. More particularly, the present invention relates to controlling the wafer edge film thickness profile in atmospheric pressure CVD processes.

2. Description of the Related Art

In a conventional deposition process such as atmospheric pressure (ATM-P) chemical vapor deposition (CVD) process, a deposition gas is supplied through a shower head. After heating causes the wafer to reach the process temperature, film deposition occurs on the wafer. For example, an oxidation film may grow on the surface of the wafer when exposed to an oxidizing precursor.

The uniformity of the film thickness depends upon a constant gas flow and uniform temperature on the wafer. Even though control of these main process parameters may generally provide uniformity in the film thickness across most of the wafer, the conventional method typically results in a film thicker at the wafer edge than the inner portions of the wafer.

Accordingly, what is needed is a process or apparatus that will provide a controlled uniform film thickness on the wafer edge during the ATM-P CVD process.

SUMMARY OF THE INVENTION

The present invention provides a process and apparatus for controlling the thickness of a film at the wafer edge during an atmospheric pressure (ATM-P) chemical vapor deposition process. The present invention exploits the fact that the film thickness at a particular wafer location may correspond to the density of the deposition gases in that wafer area. In particular, the density of the flow gases is modified in the area surrounding the wafer edge. In order to achieve uniformity of film thickness at the wafer edge, the present invention provides an apparatus and a process whereby a ring shaped gas flow control device is placed so as to surround the wafer. The height of the ring may be changed to control the growth rate on the wafer edge. In one embodiment placing the top surface of the ring higher than the wafer surface reduces the growth rate. In another embodiment placing the top surface of the ring lower than the wafer top surface increases the growth rate. Atmospheric pressure CVD refers to systems whose deposition environment operates at or near atmospheric pressure. Typically, the gas flow, temperature, and exposure time in the deposition zone determine the film thickness.

In one aspect, a chemical vapor deposition system for controlling a film thickness deposited at a wafer edge is provided. The system comprises a wafer holder for supporting a wafer and a gas flow control ring disposed on the wafer holder. The gas control ring is configured to surround the wafer and has a top surface arranged at a height relative to the top surface of the wafer to control the deposited film thickness at the wafer edge. In one aspect, the height of the top surface of the ring is in the same plane as the top surface of the wafer. The inner diameter of the gas flow control ring has a clearance relative to the periphery of the wafer of less than one mm. In another aspect, the height of the gas flow control ring top surface is higher than the top surface of the wafer.

In yet another aspect, the height of the gas flow control ring top surface is lower than the top surface of the wafer.

These and other features and advantages of the present invention are described below with reference to the drawings.

BRIEF DESCRIPTION OF THE DRAWINGS

FIG. 1 is a diagram illustrating a conventional ATM-P CVD system.

FIG. 2 is a diagram illustrating the film thickness profile produced using conventional ATM-P CVD equipment.

FIG. 3 is a diagram illustrating the results of a fluid simulation performed on conventional ATM-P CVD equipment using a conventional flat wafer holder.

FIG. 4 is a diagram illustrating top, elevation, and expanded views of a gas flow control ring in accordance with one embodiment of the present invention.

FIG. 5 is a diagram illustrating the change in film thickness plotted against changes in the ring height differential in accordance with one embodiment of the present invention.

FIG. 6 is a composite diagram illustrating the results of a fluid simulation performed on ATM-P CVD equipment using a flow control ring in accordance with one embodiment of the present invention.

FIG. 8 is a flowchart illustrating the process of providing a controlled film thickness at the wafer edge in accordance with one embodiment of the present invention.

DETAILED DESCRIPTION OF PREFERRED EMBODIMENTS

Figure 7:
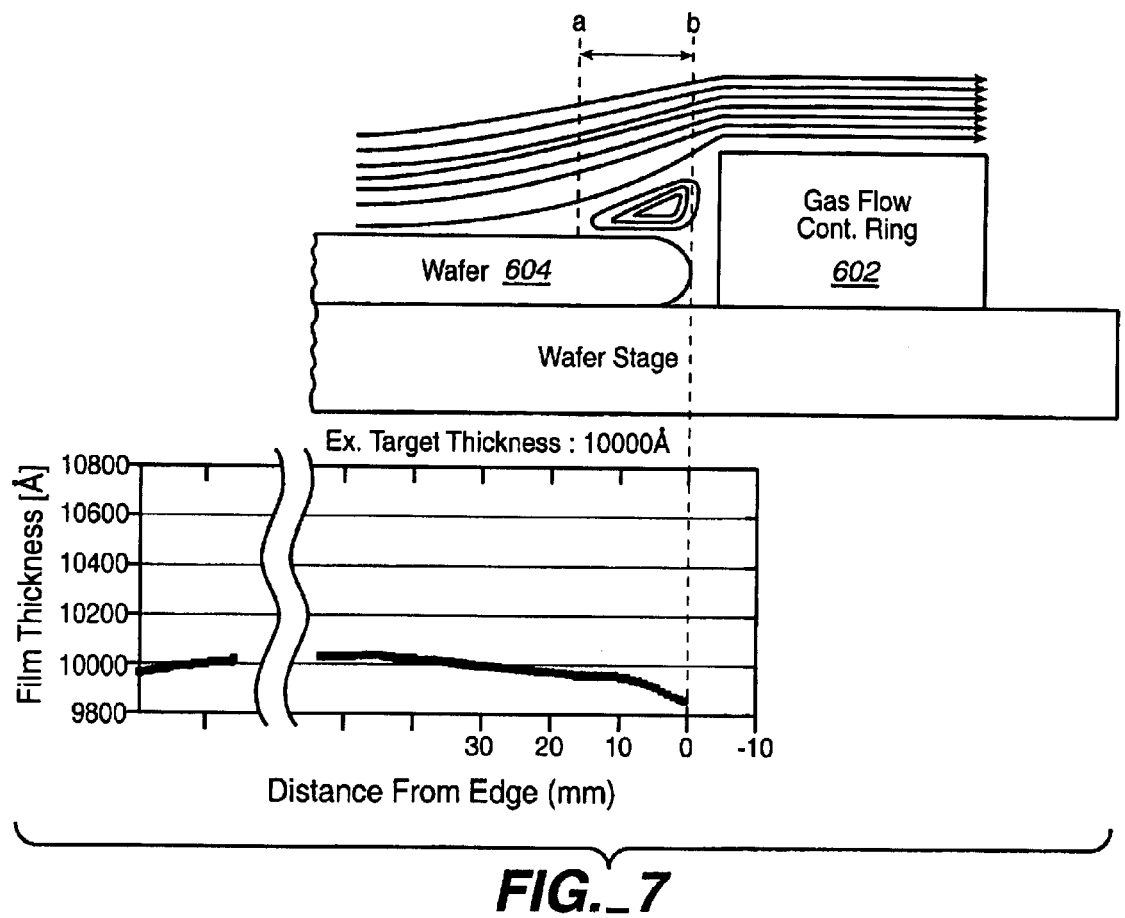
FIG. 7 is a composite diagram illustrating the results of a fluid simulation performed on ATM-P CVD equipment using a flow control ring in accordance with another embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a process and apparatus for controlling the thickness of a film at the wafer edge during an atmospheric pressure (ATM-P) chemical vapor deposition process. The present invention exploits the fact that the film thickness at a particular wafer location may correspond to the density of the deposition gases in that wafer area. In particular, the density of the flow gases is modified in the area surrounding the wafer edge. In order to achieve uniformity of film thickness at the wafer edge, the present invention provides an apparatus and a process whereby a ring shaped gas flow control device is placed so as to surround the wafer. The height of the ring may be changed to control the growth rate on the wafer edge. In one embodiment placing the top surface of the ring higher than the wafer surface reduces the growth rate. In another embodiment placing the top surface of the ring lower than the wafer top surface increases the growth rate. Atmospheric pressure CVD refers to systems whose deposition environment operates at or near atmospheric pressure. Typically, the gas flow, temperature, and exposure time in the deposition zone determine the film thickness.

FIG. 1 is a diagram illustrating a conventional ATM-P CVD system. A wafer 102 is typically supported by a wafer stage 104. CVD processes form a non-volatile solid by the reaction of gases that contain the required constituents. The process gases are known as precursors and may flow through a chamber where a chemical reaction produces a thin film material coating on the surface of the wafer or other substrate. Alternatively, a continuous CVD process may use a transfer system (i.e., a conveyor belt or a rotation table, etc.) to move the wafer through the deposition zone. A wafer heater 106 may be placed near the wafer, for example underneath the stage 104, to provide heating of the wafer 102 to accelerate the chemical reaction. A shower head 108 is located above the wafer 102 to provide a uniform controlled flow of the process gas with respect to the wafer 102. ATM-P CVD systems are typically used for the deposition of polysilicon and dielectrics. For example, a film of silicon dioxide ($SiO2$) may be grown on the wafer by selection of an appropriate temperature and precursors. The gases react with material on the substrate, creating a thin film of product material that has desirable electrical properties. High-quality films have a uniform chemical composition and thickness across the entire wafer or other substrate area. The unifonnity of the film thickness depends on both a constant gas flow and maintenance of a uniform temperature on the wafer.

FIG. 2 is a diagram illustrating the film thickness profile produced using conventional ATM-P CVD equipment. As illustrated by the wafer film thickness profile, the thickness of the wafer film at the edge region 204 is thicker than at the wafer center 206. While not wishing to be bound by any theory, it is believed that edge effects caused by the wafer edge affect the gas flow to cause nonuniformities in the film thickness at the wafer edge. Efforts at reducing the thickness at the wafer edge relative to the inner portions of the wafer by changing the main process parameters generally will not reduce the film thickness in a localized portion such as at the wafer edge without resulting in a corresponding reduction in thickness across the wafer. As semiconductor devices are scaled further, reducing the wafer edge effects may become more critical in order to obtain greater uniformity in the film thickness and thus greater uniformity in the electrical properties of the dies cut from the wafer.

FIG. 3 is a diagram illustrating the results of a fluid simulation performed on conventional ATM-P CVD equipment using a conventional flat wafer holder. As illustrated, the process gas is compressed at the wafer edge 302. That is, while not wishing to be bound by any theory, it is believed that difference in height between the wafer holder surface and the wafer surface produces a discontinuity of gas flow at the wafer edge. The compressed area 304 is believed to result in an increased deposition of the film at the wafer edge and thus resulting in the differences in film thickness at the wafer edge in comparison to the wafer inner portions.

FIG. 4 is a diagram illustrating top, elevation, and expanded views of a gas flow control ring in accordance with one embodiment of the present invention. The gas flow control ring 402 is arranged on the wafer stage 406 to surround the wafer 404. The gas flow control ring 402 is arranged so that the clearance distance 408 between the periphery of the wafer 404 and the inner diameter of the gas flow control ring 402 is minimized. In accordance with one embodiment of the present invention, the height differential 410 of the top surface of the ring 402 relative to the top surface of the wafer 404 is precisely controlled. Changing the height of the top surface of the gas flow control ring 402 provides control of the growth rate of the film on the wafer edge.

The gas flow control ring may be constructed of any suitable materials that will not undergo significant change during the ATM-P CVD process. SiC and $Al_2O_3$ are examples of materials suitable for constructing the gas flow control ring but are not intended to be limiting. Preferably the material selected for the gas flow control ring will have a relatively low thermal coefficient of expansion and will be nonreactive to the precursors used in the ATM-P CVD process, although the invention is not so limited. Of course, a variety of materials other than those listed above may be used.

Although the clearance distance 408 between the periphery of the wafer and the inner diameter of the gas flow control ring 402 is preferably minimized, such as for example in one embodiment less than 1 mm, suitable clearance distances are a function of the ring height differential 408. It is expected, however, that through the use of minimized clearance distances the change in film thickness may approximate better a linear relationship with changes in the ring height differential. Generally, the width of a ring section (i.e., the difference between the outer diameter and the inner diameter divided by 2) of the gas flow control ring may vary considerably without affecting its performance for wafer edge thickness control. However, a width of a section of a gas flow control ring is preferably greater than about 8 mm. Thus, for example, as applied to 300 mm wafers, a preferable configuration includes an inner diameter of the gas flow control ring of about 300 mm and an outer diameter of greater than or equal to about 316 mm. These dimensions are for illustrative purposes and are not intended to limit the present invention. Any width of the ring sections that allows repeatability in control of the wafer edge film thickness is expected to be suitable.

In one embodiment, the wafer holder is a susceptor a plate on which wafer may be heated during deposition steps. The gas ring may be attached to the wafer holder by any of a variety of methods. For example, one preferable embodiment includes an "all-in-one" design, whereby the gas ring is formed integrally with the wafer holder. With this arrangement, the gas flow control ring may be used in any orientation, i.e., holding the wafer, for example, horizontally, vertically, or upside down. However, some flexibility is lost in that the gas flow control ring height must be fixed beforehand. Thus, the gas flow control ring height above the wafer surface may not be easily adapted to changed requirements for the layer thickness at the wafer edge. As a further example, another preferable embodiment providing flexibility in orientation of the wafer and adaptability to changed height requirements includes a bolt-on configuration whereby the gas flow control ring is bolted to the susceptor. Alternatively, in one embodiment, the gas flow control ring may be inlaid in a ditch formed in a susceptor surface.

FIG. 5 is a diagram illustrating an example of the change in film thickness plotted against changes in the ring height differential 410 in accordance with one embodiment of the present invention. The change in film thickness for purposes of the illustration is determined by evaluating the differences in film thickness at the wafer edge 412 and at an inner point 414 on the wafer approximately 5 mm from the wafer edge 412, as illustrated in FIG. 4. FIG. 5 illustrates the relationship between the ring height differential 410 and the growth rate in the film. As illustrated, the growth rate (i.e., the change in film thickness) is increased for lower ring heights. For example, a ring height differential 410 of 700 microns (i.e., a ring having a top surface 700 microns above the surface of the wafer before commencing the ATM-P CVD process) produced a change in film thickness of −2000 Angstroms relative to a ring height top surface in the same plane as the wafer top surface. Conversely, a ring height of −700 microns (i.e., a ring having a top surface 700 microns below the top surface of the wafer) produced an increased film thickness of 1500 Angstroms relative to the thickness at the inner point 414 (i.e., the inner point 5 mm from the wafer edge).

FIG. 6 is a composite diagram illustrating the results of a fluid simulation performed on ATM-P CVD equipment using a flow control ring in accordance with one embodiment of the present invention. As illustrated, the gas flow control ring 602 surrounds the periphery of the wafer 604. In this embodiment, the top surface of the gas flow control ring 602 lies in the same plane as the top surface of the wafer 604. The lower portion of the diagram illustrates the film thickness profile of the wafer. As illustrated, the arrangement using the gas flow control ring having a height equal to the wafer minimizes the increased film thickness present in conventional ATM-P CVD equipment.

FIG. 7 is a composite diagram illustrating the results of a fluid simulation performed on ATM-P CVD equipment using a flow control ring in accordance with another embodiment of the present invention. As illustrated, the gas flow control ring 602 again surrounds the periphery of the wafer 604. In this embodiment, the top surface of the gas flow control ring 602 lies above the top surface of the wafer 604. In this embodiment, while not wishing to be bound by any theory, the higher height of the top surface of the gas flow control ring 602 is believed to cause the gas flow to separate from the top surface of the wafer 604. Accordingly, the deposition gas concentration was decreased on the wafer edge and produced a resultant decrease in the growth rate of the film near the wafer edge.

FIG. 8 is a flowchart illustrating the process of providing a controlled film thickness at the wafer edge in accordance with one embodiment of the present invention. The process commences, according to one embodiment of the present invention, by determining a desired wafer edge thickness relative to inner portions of the wafer in a step 804. Next, in steps 805–807, a height for the gas flow control ring is selected. After the desired edge thickness is determined in step 804, the clearance between the wafer edge and the inner diameter of the gas ring is selected in a step 805. This clearance is preferably minimized, but the minimal distance is a function of the precision of the wafer transfer system. That is, the precision available in transferring wafers to and from the wafer holders determines the clearance which can be fixed between the gas flow control ring inner diameter and the wafer edge. Thus, the precision of the wafer transfer system is checked before fixing the clearance. In a next step 806, the relationship between the film thickness at the wafer edge and the ring height is examined using the clearance selected and fixed in step 805. Next, in a step 807, the height of the gas flow control ring for each process application is set, for example, by using empirical data defining the relationship between desired wafer edge film thickness and gas flow control ring height for a predetermined clearance. For a gas flow control ring, empirical data such as shown above in FIGS. 5–7 may be used to assist in making this selection.

Next, in a step 808, the selected gas control ring is arranged on the wafer holder and the wafer is placed such that the ring surrounds the wafer when processed in the ATM-P CVD chamber. Preferably, the wafer will be centered within the gas flow control ring. In a final step 810, the atmospheric pressure CVD process is performed using the gas flow control ring in conjunction with conventional ATM-P CVD equipment including, but not limited to, an appropriate chamber. Although the process steps were illustrated contemplating a bolt on or other removable gas ring (e.g. a ring placed in a ditch in the susceptor) the description is intended to be illustrative and not limiting. The process steps are equally adaptable to all types of suitable gas rings, such as, for example, integrally formed (all-in-one) rings, with no more than slight modifications within the capabilities of one skilled in the art.

The preceding simulations are intended to be illustrative and not limiting. The process and apparatus of the present invention may be used to produce any desired thickness of the film at the wafer edge, whether thin or thick or equivalent to other portions of the wafer by selecting suitable sizes and configurations of a gas control ring in accordance with the teachings of the present invention. The techniques described in the embodiments of the present invention are applicable to the formation of deposition films on all wafers irrespective of the final thickness of the films. They are particularly suitable for deep sub micron process technologies. As device sizes shrink, control of film thickness across the entire wafer is especially important to avoid yield loss from uncontrolled or poorly controlled film thickness at the wafer edge. Thus, the use of the techniques and apparatus of the present invention will avoid many of the problems associated with atmospheric pressure CVD processes.

Although the foregoing invention has been described in some detail for purposes of clarity of understanding, it will be apparent that certain changes and modifications may be practiced within the scope of the appended claims. For example, embodiments of the present invention may be used with any CVD process and with any form of substrate wherein the process gases combine to form a film on the substrate. Thus, the scope of the present invention is not limited to the formation of films on semiconductor substrates. Accordingly, the present embodiments are to be considered as illustrative and not restrictive, and the invention is not to be limited to the details given herin, but may be modified within the scope and equivalents of the appended claims.

What is claimed is:

1. A chemical vapor deposition process for controlling the thickness of a film on an edge of a wafer, the process comprising:

selecting a gas flow control ring corresponding to a film thickness at the wafer edge;

disposing the gas flow control ring about a wafer holding region on a wafer holder, wherein the gas flow control ring has a top surface configured relative to the top surface of the wafer to provide control of the film thickness at the wafer edge; and performing an atmospheric pressure chemical vapor deposition process on the wafer.

2. The chemical vapor deposition process as recited in claim 1 wherein the gas flow control ring is configured so that the top surface of the gas flow control ring in the same plane as the top surface of the wafer.

3. The chemical vapor deposition process as recited in claim 1 wherein the gas flow control ring is configured so that the gas flow control ring has a top surface higher in elevation than the top surface of the wafer.

4. The chemical vapor deposition process as recited in claim 1 wherein the gas flow control ring is configured so that the gas flow control ring has a top surface lower in elevation than the top surface of the wafer.

5. The chemical vapor deposition process as recited in claim 1 wherein the gas flow control ring is configured so that an inner diameter of the gas flow control ring is separated from the periphery of the wafer by a distance of less than one mm.

6. The chemical vapor deposition process as recited in claim 1 wherein the gas flow control ring is attached to the wafer holder.

7. The chemical vapor deposition process as recited in claim 1 wherein the gas flow control ring is formed integrally with the wafer holder.

8. The chemical vapor deposition process as recited in claim 1 wherein the top surface of the gas flow control ring is flat and parallel to the wafer top surface.

9. The chemical vapor deposition process as recited in claim 1 wherein the gas flow control ring has a section width greater than or equal to about 8 mm.

10. The chemical vapor deposition process as recited in claim 1 wherein the gas flow control ring is configured so that the clearance between an inner diameter of the gas flow control ring and the periphery of the wafer is minimized.

* * * * *